(12) United States Patent
Sakaino

(10) Patent No.: US 8,472,490 B2
(45) Date of Patent: Jun. 25, 2013

(54) SEMICONDUCTOR OPTICAL ELEMENT AND INTEGRATED SEMICONDUCTOR OPTICAL ELEMENT

(75) Inventor: Go Sakaino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 364 days.

(21) Appl. No.: 12/779,090

(22) Filed: May 13, 2010

(65) Prior Publication Data

US 2011/0158279 A1    Jun. 30, 2011

(30) Foreign Application Priority Data

Dec. 24, 2009  (JP) .................................. 2009-292509

(51) Int. Cl.
*H01S 5/00*       (2006.01)
(52) U.S. Cl.
USPC ..................................... 372/46.01; 372/43.01
(58) Field of Classification Search
USPC ....................................................... 372/46.01
See application file for complete search history.

(56) References Cited

U.S. PATENT DOCUMENTS

| | | | |
|---|---|---|---|
| 5,636,237 A | 6/1997 | Terakado et al. | |
| 6,717,187 B2 | 4/2004 | Kondo et al. | |
| 7,701,993 B2 | 4/2010 | Iga et al. | |
| 7,835,413 B2 | 11/2010 | Takiguchi et al. | |
| 2009/0290611 A1* | 11/2009 | Takiguchi et al. | 372/45.011 |

FOREIGN PATENT DOCUMENTS

| | | |
|---|---|---|
| CN | 101593930 | 12/2009 |
| JP | 8-213691 A | 8/1996 |
| JP | 2003-78212 A | 3/2003 |
| WO | WO 2005/117217 A1 | 12/2005 |

OTHER PUBLICATIONS

State Intellectual Property Office of the People'S Republic of China, Office Action, (Jul. 4, 2012).

* cited by examiner

*Primary Examiner* — Xinning Niu
(74) *Attorney, Agent, or Firm* — Leydig, Voit & Mayer, Ltd.

(57) ABSTRACT

A semiconductor optical element and an integrated semiconductor optical element suppressing leakage current flow through a burying layer. A mesa-stripe-shaped laminate structure includes a p-type cladding layer, an active layer, and an n-type cladding layer. A burying layer on a side of the laminated structure includes, a first p-type semiconductor layer, a first n-type semiconductor layer, an Fe-doped semiconductor layer, a second n-type semiconductor layer, a low carrier concentration semiconductor layer, and a second p-type semiconductor layer. The Fe-doped semiconductor layer is not grown on a (111)B surface of the first p-type semiconductor layer and of the first n-type semiconductor layer. The second n-type semiconductor layer is not grown on a (111)B surface of the first p-type semiconductor layer, of the first n-type semiconductor layer, and of the Fe-doped semiconductor layer.

4 Claims, 12 Drawing Sheets

PRIOR ART

PRIOR ART

SEMICONDUCTOR OPTICAL ELEMENT AND INTEGRATED SEMICONDUCTOR OPTICAL ELEMENT

BACKGROUND OF THE INVENTION

1. Field of the Invention

The present invention relates to a semiconductor optical element and an integrated semiconductor optical element applied to, for example, an optical communications system.

2. Description of the Related Art

In recent years, with regard to a semiconductor optical element, application thereof in which, from the viewpoint of power savings, temperature rise suppression of the element, and the like, high efficiency use of injected current is required, and, at the same time, operation at higher speed than ever is required is increasing. For example, when the semiconductor optical element is a buried semiconductor laser, for the purpose of materializing high efficiency, in order to inject with efficiency current into an active layer for converting electricity to light, it is necessary to suppress a reactive current flow through a buried layer which is formed on both sides of an active layer and which has a current blocking function. Further, similarly, with regard to a buried semiconductor laser, in order to materialize high speed response characteristics, it is necessary to decrease a parasitic capacitance of the buried layer.

It is known that, in order to materialize both the high efficiency and the high speed response characteristics at the same time, to use a semi-insulating semiconductor layer doped with Fe which has electron-capturing characteristics as the buried layer is effective. FIG. 10A illustrates a semiconductor optical element (buried semiconductor laser) which uses this Fe-doped semiconductor layer as a buried layer.

In FIG. 10A, a p-type cladding InP layer 52, an active layer 53, and an n-type cladding InP layer 54 are laminated in the stated order from the bottom on an InP substrate 51 to form a mesa-stripe-shaped laminate. A buried layer is formed on each side of the laminate. In the buried layer, a first p-type InP layer 55, a first n-type InP layer 56, and an Fe-doped semiconductor layer 57 are laminated in the stated order from the bottom. An n-type contact layer 58 is formed on the laminate and the buried layers. The first p-type InP layer 55 and the Fe-doped semiconductor layer 57 are provided in contact with each other.

Here, if the Fe-doped semiconductor layer 57 is formed so as to be in contact with a semiconductor layer containing Zn which is a typical dopant of a p-type semiconductor, because Fe and Zn vigorously diffuse into each other, the layer changes into a p-type semiconductor layer. In this case, as illustrated in FIG. 10A, leakage current paths which is irrelevant to action of the semiconductor optical element are formed in the buried layers, and thus, there are problems that reactive current increases to decrease the efficiency and the high speed response characteristics are deteriorated.

In order to solve those problems, methods in which an Fe-doped semiconductor layer is grown so as not to be in contact with a p-type semiconductor layer, in which an Fe-doped semiconductor layer is isolated by an n-type semiconductor layer, and the like are proposed. FIGS. 10B and 10C illustrate semiconductor optical elements (buried semiconductor lasers) in which an Fe-doped semiconductor layer is grown so as not to be in contact with a p-type semiconductor layer. FIG. 10D illustrates a semiconductor optical element (buried semiconductor laser) in which an Fe-doped semiconductor layer is isolated by an n-type semiconductor layer.

In FIG. 10B, the buried layer is the same as the buried layer illustrated in FIG. 10A, but the first p-type InP layer 55 and the Fe-doped semiconductor layer 57 are not provided in contact with each other. Further, in FIG. 10C, the buried layer has, in addition to the buried layer illustrated in FIG. 10B, a second n-type InP layer 59 and a second p-type InP layer 60, and the first p-type InP layer 55 and the Fe-doped semiconductor layer 57 are not provided in contact with each other.

Further, in FIG. 10D, the buried layer is the same as the buried layer illustrated in FIG. 10C, but the Fe-doped semiconductor layer 57 is isolated by an n-type semiconductor.

When the Fe-doped semiconductor layer 57 is grown so as not to be in contact with a p-type semiconductor layer, as illustrated in FIGS. 10B and 10C, there is a problem that, because there are the plurality of n-type semiconductor layers, reactive current increases to decrease the efficiency.

When the Fe-doped semiconductor layer 57 is isolated by an n-type semiconductor layer, as illustrated in FIG. 10D, there is a problem that, because the semi-insulating Fe-doped semiconductor layer 57 is surrounded by the n-type semiconductor layers, the potential of an upper portion of the first p-type InP layer 55 is almost the same as the potential of a lower portion of the second p-type InP layer 60, a parasitic capacitance of the buried layer increases, and the high speed response characteristics are deteriorated.

More specifically, in a semiconductor optical element in which an Fe-doped semiconductor layer is used as a buried layer, there are problems that, due to interdiffusion between Fe and Zn and the like, reactive current increases to decrease the efficiency and the high speed response characteristics are deteriorated.

Therefore, in order to solve those problems, it is proposed that a semi-insulating semiconductor layer doped with Ru which causes almost no interdiffusion is used as a buried layer (see, for example, Japanese Patent No. 4249222).

By using the Ru-doped semiconductor layer, in forming the buried layer, it is not necessary to limit the kind of the semiconductor layer to be in contact therewith, and thus, design flexibility may be improved. Further, because an Ru-doped semiconductor layer has a characteristic to capture not only electrons but also holes, reactive current is also effectively suppressed.

However, because crystal growth conditions of an Ru-doped semiconductor layer for obtaining a satisfactory surface state as that of an Fe-doped semiconductor layer are very strict, an Ru-doped semiconductor layer lacks stability, and it is known that this tendency is conspicuous particularly when the Ru-doped semiconductor layer is thick. Further, because the crystal growth conditions are strict, it may be difficult to obtain a high activation rate and a high resistivity. Therefore, there is a problem that it may be difficult to, in order to decrease the parasitic capacitance and to materialize high speed response characteristics, grow a thick Ru-doped semiconductor layer and to exert a current blocking function only by the Ru-doped semiconductor layer.

Further, in order to solve problems in relation to a semiconductor optical element in which an Fe-doped semiconductor layer is used as a buried layer, to use a low carrier concentration semiconductor layer as a buried layer is proposed (see, for example, Japanese Patent Application Laid-open No. Hei 08-213691 and U.S. Pat. No. 5,636,237).

FIG. 11 illustrates a semiconductor optical element (buried semiconductor laser) in which such a low carrier concentration semiconductor layer is used as a buried layer.

In FIG. 11, the p-type cladding InP layer 52, the active layer 53, and the n-type cladding InP layer 54 are laminated in the stated order from the bottom on the InP substrate 51 to form the mesa-stripe-shaped laminate. The buried layer is formed on each side of the laminate. In the buried layer, the first p-type InP layer 55, the first n-type InP layer 56, the undoped i-type InP layer 61, and the second p-type InP layer 60 are laminated in the stated order from the bottom. The n-type contact layer 58 is formed on the laminate and the buried layers.

When such a low carrier concentration semiconductor layer (undoped i-type InP layer 61) is used as a buried layer, because existence of the undoped i-type InP layer 61 expands a depletion layer and the parasitic capacitance of the buried layers is decreased, the high speed response characteristics may be improved.

However, such conventional art has the following problems.

In the semiconductor optical element disclosed in Japanese Patent Application Laid-open No. Hei 08-213691 and U.S. Pat. No. 5,636,237, when the low carrier concentration semiconductor layer is grown in the buried layers on both sides of the mesa-stripe-shaped laminate, the low carrier concentration semiconductor layer is abnormally grown in proximity to the mesa-stripe-shaped portion (in particular, between the n-type semiconductor layer of the buried layers and the n-type cladding semiconductor layer or the n-type contact layer), and further, it is known that this tendency is conspicuous when the low carrier concentration semiconductor layer is thick.

Therefore, in this case, because the low carrier concentration semiconductor layer exhibits properties of a weak n-type semiconductor, as illustrated in FIG. 11, leakage current paths are formed in the buried layers, and thus, there is a problem that reactive current increases to decrease the efficiency. Further, when the low carrier concentration semiconductor layer is grown so as to be thin in order to suppress a reactive current flow through the buried layers, there is a problem that the parasitic capacitance of the buried layers increases to deteriorate the high speed response characteristics.

It is to be noted that the adverse effect of the increase in the reactive current is exerted not only on a single semiconductor optical element having only one function but also similarly on an integrated semiconductor optical element which quests for high speed response characteristics and power savings. Because the structure of an integrated semiconductor optical element is complicated, to suppress the reactive current therein is difficult in many cases. Further, because, in an integrated semiconductor optical element, semiconductor regions having different functions from one another and integrated so as to be adjacent to one another have structures different from one another, and the structures may not be greatly changed, to suppress leakage current to the integrated semiconductor regions is difficult in many cases.

Here, as an example, an integrated semiconductor optical element in which a waveguide semiconductor layer is formed by butt joint regrowth with respect to a semiconductor laser is illustrated in FIG. 12.

In FIG. 12, the active layer 53 and the n-type cladding InP layer 54 are laminated in the stated order from the bottom on the p-type cladding InP layer 52 which is laminated on an InP substrate to form a mesa-stripe-shaped laminate. An undoped type semiconductor layer 63 and an undoped i-type InP layer 61 are laminated in the stated order from the bottom on side portions of the laminate, using an insulating film mask 62 for selective growth.

In the integrated semiconductor optical element illustrated in FIG. 12, there is a current path from the upper cladding layer of the semiconductor laser portion to the upper cladding layer of the waveguide portion. In particular, when the upper cladding layer of the semiconductor laser portion is an n-type semiconductor, it is difficult to suppress the leakage current.

SUMMARY OF THE INVENTION

The present invention is made to solve the problems described above. An object of the present invention is to provide a semiconductor optical element and an integrated semiconductor optical element in which a side portion of a mesa-stripe-shaped laminate has a buried layer, the semiconductor optical element and the integrated semiconductor optical element being able to suppress a reactive current and materialize high speed response characteristics.

According to an aspect of the present invention, a semiconductor optical element includes: a p-type semiconductor substrate; a mesa-stripe-shaped laminate formed by laminating at least a p-type cladding layer, an active layer, and an n-type cladding layer in the stated order from a bottom on the p-type semiconductor substrate; and a buried layer formed on a side portion of the mesa-stripe-shaped laminate, in which: the buried layer being formed by laminating a first p-type semiconductor layer, a first n-type semiconductor layer, an Fe-doped semiconductor layer, a second n-type semiconductor layer, a low carrier concentration semiconductor layer, and a second p-type semiconductor layer in the stated order from the bottom; the Fe-doped semiconductor layer is not grown on a (111)B surface of a crystal plane formed by the first p-type semiconductor layer and the first n-type semiconductor layer; and the second n-type semiconductor layer is not grown on a (111)B surface of a crystal plane formed by the first p-type semiconductor layer, the first n-type semiconductor layer, and the Fe-doped semiconductor layer.

Further, according to another aspect of the present invention, a semiconductor optical element includes: a p-type semiconductor substrate; a mesa-stripe-shaped laminate formed by laminating at least a p-type cladding layer, an active layer, and an n-type cladding layer in the stated order from a bottom on the p-type semiconductor substrate; and a buried layer formed on a side portion of the mesa-stripe-shaped laminate, in which: the buried layer being formed by laminating a first p-type semiconductor layer, a first n-type semiconductor layer, a low carrier concentration semiconductor layer, and a second p-type semiconductor layer in the stated order from the bottom; and the low carrier concentration semiconductor layer is not grown on a (111)B surface of a crystal plane formed by the first p-type semiconductor layer and the first n-type semiconductor layer.

Further, according to still another aspect of the present invention, in an integrated semiconductor optical element, at least a p-type cladding layer, an active layer, and an n-type cladding layer are laminated in the stated order from a bottom on a p-type semiconductor substrate to form a mesa-stripe-shaped laminate of a semiconductor optical element, and a side portion of the semiconductor optical element has a regrown semiconductor layer formed thereon by selective growth. As a lowermost layer of the regrown semiconductor layer, one of an AlInAs layer and an AlGaInAs layer of one of p-type and low carrier concentration is laminated.

According to the present invention, the Fe-doped semiconductor layer formed in the buried layer of the semiconductor optical element is not grown on the (111)B surface of the crystal plane formed by the first p-type semiconductor layer and the first n-type semiconductor layer, and the second n-type semiconductor layer formed in the buried layer is not grown on the (111)B surface of the crystal plane formed by the first p-type semiconductor layer, the first n-type semiconductor layer, and the Fe-doped semiconductor layer. This prevents Zn as a dopant in the first p-type semiconductor layer and the second p-type semiconductor layer from diffusing from the first p-type semiconductor layer and the second p-type semiconductor layer into the Fe-doped semiconductor layer.

Further, according to the present invention, the low carrier concentration semiconductor layer formed in the buried layer of the semiconductor optical element is not grown on the (111)B surface of the crystal plane formed by the first p-type semiconductor layer and the first n-type semiconductor layer. This makes it possible to form the semiconductor optical element without consideration of interdiffusion.

Therefore, a semiconductor optical element which may suppress a reactive current flow through the buried layer and may materialize high speed response characteristics may be obtained.

Further, according to the present invention, in the integrated semiconductor optical element, as the lowermost layer of the regrown semiconductor layer formed on the side portion of the semiconductor optical element having the mesa-stripe-shaped laminate formed therein, one of an AlInAs layer and an AlGaInAs layer of one of p-type and low carrier concentration is laminated. By using one of an AlInAs layer and an AlGaInAs layer which has a high barrier to electrons, an integrated semiconductor optical element which may suppress the reactive current and may materialize the high speed response characteristics may be obtained.

DETAILED DESCRIPTION OF THE PREFERRED EMBODIMENTS

Figure 1:
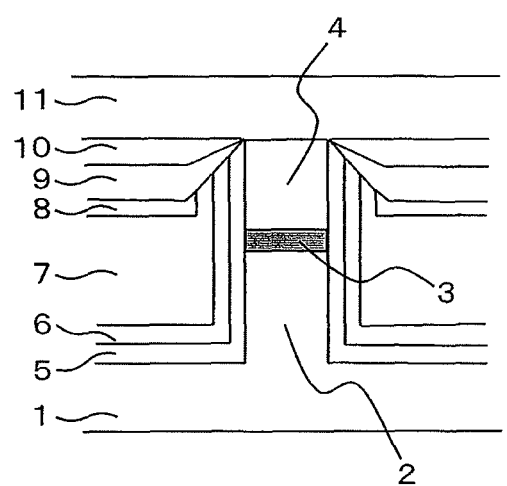
FIG. 1 is a sectional view illustrating a structure of a semiconductor optical element according to Embodiment 1 of the present invention.

Preferred embodiments of a semiconductor optical element and an integrated semiconductor optical element according to the present invention are described in the following with reference to the attached drawings. Throughout the drawings, the same reference numerals are used to designate the same or similar parts.

Embodiment 1

FIG. 1 is a sectional view illustrating a structure of a semiconductor optical element according to Embodiment 1 of the present invention. Here, as an example of the semiconductor optical element, a distributed-feedback semiconductor laser is described.

In FIG. 1, a p-type cladding InP layer 2, an active layer 3, and an n-type cladding InP layer 4 are laminated in the stated order from the bottom on an InP substrate 1 to form a mesa-stripe-shaped laminate. A buried layer is formed on each side of the laminate. In the buried layer, a first p-type InP layer 5, a first n-type InP layer 6, an Fe-doped semiconductor layer 7, a second n-type InP layer 8, an undoped 1-type InP layer 9, and a second p-type InP layer 10 are laminated in the stated order from the bottom. An n-type contact layer 11 is formed on the laminate and the buried layers.

Further, in FIG. 1, the Fe-doped semiconductor layer 7 which is formed in the buried layer and which is semi-insulating is not provided in contact with the p-type semiconductor layers in which Zn is contained as a dopant, and further, is not provided in contact with a region in the undoped i-type InP layer 9 into which Zn is diffused. This prevents interdiffusion between Fe and Zn, and prevents leakage current paths from being formed in the buried layer. Further, because Zn is diffused into an upper portion of the undoped i-type InP layer 9 to make the upper portion of the undoped i-type InP layer 9 a p-type semiconductor, leakage current is not caused through the undoped layer which exhibits characteristics similar to those of an n-type semiconductor.

In order to materialize such a structure, it is indispensable that the Fe-doped semiconductor layer 7 and the second n-type InP layer 8 are not grown on the (111)B surface. This is materialized by making sufficiently high the mesa-stripe-shaped laminate and introducing a halogenated gas such as HCl into a growth chamber when the Fe-doped semiconductor layer 7 and the second n-type InP layer 8 are grown.

Figure 2:
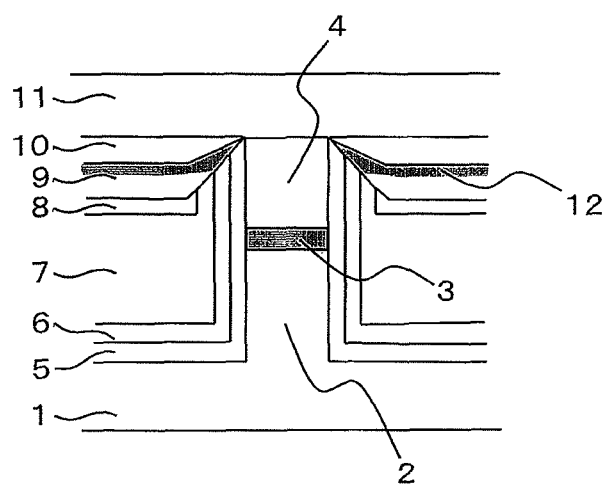
FIG. 2 is a sectional view illustrating an undoped layer into which Zn is diffused of the semiconductor optical element according to Embodiment 1 of the present invention.

The undoped i-type InP layer 9 is grown after the Fe-doped semiconductor layer 7 and the second n-type InP layer 8 are grown. It is necessary that, eventually, the undoped i-type InP layer 9 is provided in contact with the Fe-doped semiconductor layer 7, and, as illustrated in FIG. 2, a region 12 in the undoped i-type InP layer 9 into which Zn is diffused is prevented from being in contact with the Fe-doped semiconductor layer 7. More specifically, shape control of the undoped i-type InP layer 9 is required.

Therefore, here, also, as necessary, a halogenated gas such as HCl is introduced into the growth chamber when the undoped i-type InP layer 9 is grown. The height of the mesa-stripe-shaped laminate, the thicknesses of the layers below the undoped i-type InP layer 9, and the thickness and the shape of the undoped i-type InP layer 9 are determined taking into consideration the diffusion length of Zn which depends on the temperature when the semiconductor optical element is manufactured and the like.

Next, process steps of manufacturing the semiconductor optical element according to Embodiment 1 of the present invention are described with reference to FIGS. 3A to 3J.

Figure 3A:
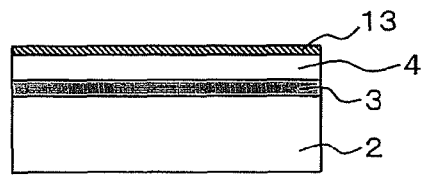
FIGS. 3A to 3J illustrate process steps of manufacturing the semiconductor optical element according to Embodiment 1 of the present invention.
Figure 3B:
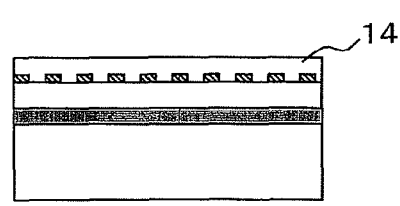
Figure 3C:
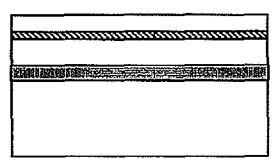

First, the active layer 3 and the n-type cladding InP layer 4 are laminated in the stated order from the bottom on the p-type cladding InP layer 2 which is laminated on the p-type semiconductor InP substrate having plane orientation (100) (see FIG. 3A). Here, a diffraction grating layer 13 is formed in the n-type cladding InP layer 4.

Then, a diffraction grating is formed by interference exposure, electron beam exposure, or the like in order to obtain an oscillation wavelength necessary for the diffraction grating layer 13 in the n-type cladding InP layer 4. The n-type cladding InP layer 4 is further laminated on the diffraction grating layer 13 to form a diffraction grating buried layer 14 (see FIGS. 3B and 3C).

Figure 3D:
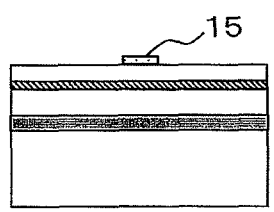

Then, an insulating film mask 15 of, for example, $SiO_2$ is formed on the diffraction grating buried layer 14 at a width of about 1 to 2 μm (see FIG. 3D).

Figure 3E:
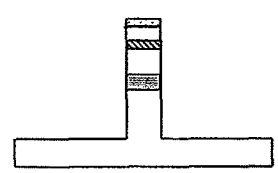

Next, the mesa-stripe-shaped laminate is formed at a height of about 2 to 5 μm by dry etching using a reactive gas or wet etching using a chemical solution (see FIG. 3E).

Figure 3F:
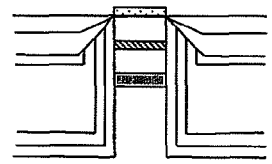

Then, the first p-type InP layer 5, the first n-type InP layer 6, the Fe-doped semiconductor layer 7, the second n-type InP layer 8, the undoped i-type InP layer 9, and the second p-type InP layer 10 are laminated in the stated order from the bottom on each side of the mesa-stripe-shaped laminate (see FIG. 3F). Here, the Fe-doped semiconductor layer 7 is not grown on the (111)B surface of the crystal plane formed by the first p-type InP layer 5 and the first n-type InP layer 6, and further, the second n-type InP layer 8 is not grown on the (111)B surface of the crystal plane formed by the first p-type InP layer 5, the first n-type InP layer 6, and the Fe-doped semiconductor layer 7.

Figure 3G:
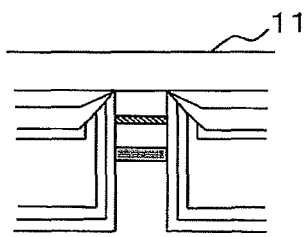

Then, the insulating film mask 15 is removed and the n-type contact layer 11 is grown on the laminate and the buried layers (see FIG. 3G).

Figure 3H:
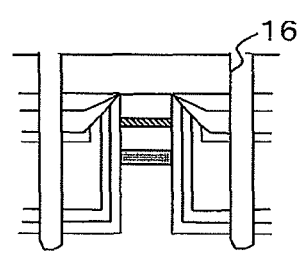

Next, in order to decrease the parasitic capacitance of the buried layer, grooves 16 for isolation are formed on both sides of the mesa-stripe-shaped laminate such that the distance between the grooves being about 5 to 10 μm with the mesa-stripe-shaped laminate being centered (see FIG. 3H).

Figure 3I:
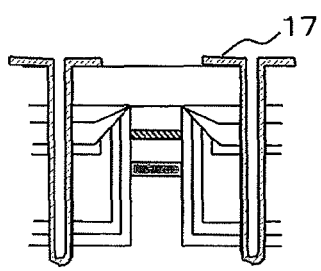
Figure 3J:
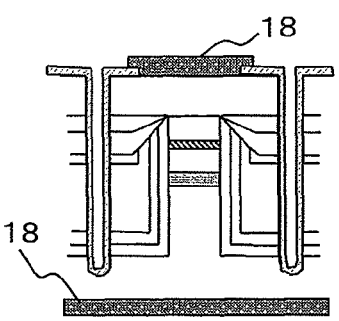

Then, an insulating film 17 is formed on a frontmost surface, and the insulating film 17 is removed such that the width of the removed portion thereof is about 3 to 5 μm with the mesa-stripe-shaped laminate being centered (see FIG. 3I).

Next, an electrode 18 is formed on the portion in which the insulating film 17 is removed. Further, with regard to the side of the p-type semiconductor InP substrate, the substrate is ground so as to have an appropriate thickness and an electrode 18 is formed thereon (see FIG. 3J).

After that, an optical end face is formed utilizing a cleavage plane of the crystal, and a coating for controlling the reflectivity is applied to the optical end face. Finally, separation of elements is achieved to complete the semiconductor optical element.

In the semiconductor optical element disclosed in the above-mentioned Japanese Patent Application Laid-open No. Hei 08-213691 and U.S. Pat. No. 5,636,237, because a p-type semiconductor layer and the semi-insulating InP current blocking layer which corresponds to the Fe-doped semiconductor layer are provided in contact with each other, interdiffusion between Fe and Zn is caused, to thereby increase the leakage current. On the other hand, the semiconductor optical element according to Embodiment 1 of the present invention is characterized in that a p-type semiconductor layer and the Fe-doped semiconductor layer 7 are not provided in contact with each other, and is clearly different from the semiconductor optical element disclosed in Japanese Patent Application Laid-open No. Hei 08-213691 and U.S. Pat. No. 5,636,237.

As described above, according to Embodiment 1, the Fe-doped semiconductor layer formed in the buried layer is not grown on the (111)B surface of the crystal plane formed by a first p-type semiconductor layer and a first n-type semiconductor layer, and further, a second n-type semiconductor layer formed in the buried layer is not grown on the (111)B surface of the crystal plane formed by the first p-type semiconductor layer, the first n-type semiconductor layer, and the Fe-doped semiconductor layer.

This prevents Zn as a dopant in the first p-type semiconductor layer and the second p-type semiconductor layer from diffusing from the first p-type semiconductor layer and the second p-type semiconductor layer into the Fe-doped semiconductor layer.

Therefore, a semiconductor optical element which may suppress a reactive current flow through the buried layer and may materialize high speed response characteristics may be obtained.

Embodiment 2

Figure 4:
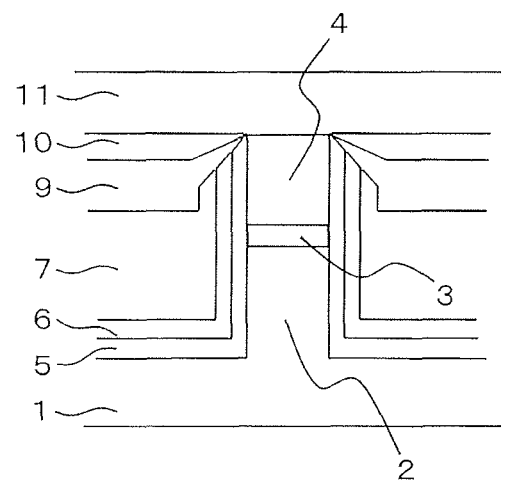
FIG. 4 is a sectional view illustrating a structure of a semiconductor optical element according to Embodiment 2 of the present invention.

FIG. 4 is a sectional view illustrating a structure of a semiconductor optical element according to Embodiment 2 of the present invention.

In a distributed-feedback semiconductor laser illustrated in FIG. 4, the second n-type InP layer 8 illustrated in FIG. 1 is replaced by the undoped i-type InP layer 9. As a result of the replacement of the second n-type InP layer 8, as shown in FIG. 4, the undoped i-type InP layer is grown on the (111)B surface of each of the first p-type InP layer 5, the first n-type InP layer 6, and the Fe-doped semiconductor layer 7.

According to Embodiment 2, effects similar to those of Embodiment 1 may be obtained, and, in addition, because a process step of growing the second n-type InP layer is unnecessary, the process may be simplified.

Embodiment 3

Figure 5:
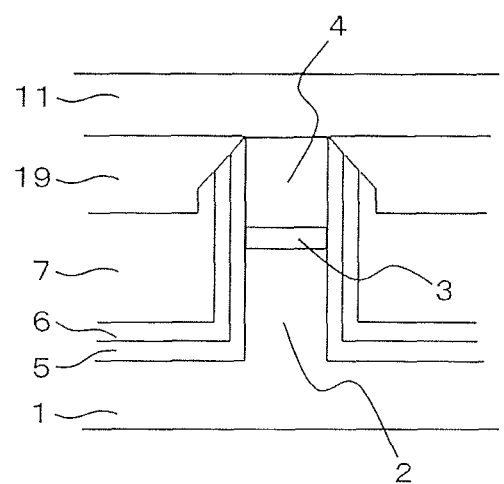
FIG. 5 is a sectional view illustrating a structure of a semiconductor optical element according to Embodiment 3 of the present invention.

FIG. 5 is a sectional view illustrating a structure of a semiconductor optical element according to Embodiment 3 of the present invention.

In a distributed-feedback semiconductor laser illustrated in FIG. 5, three layers of the second n-type InP layer 8, the undoped i-type InP layer 9, and the second p-type InP layer 10, illustrated in FIG. 1 are replaced by an Ru-doped semiconductor layer 19.

It is to be noted that, instead of the three layers of the second n-type InP layer 8, the undoped i-type InP layer 9, and the second p-type InP layer 10, only the undoped i-type InP layer 9, two layers of the umdoped i-type InP layer 9 and the second p-type InP layer 10, or two layers of the second n-type InP layer 8 and the undoped i-type InP layer 9 may be replaced by the Ru-doped semiconductor layer 19.

Embodiment 3 has the advantage that, because almost no interdiffusion is caused between Ru and Zn, compared with the case of Embodiment 1 described above, the shapes of the mesa-stripe-shaped laminate and the buried layer are not required to be controlled with consideration of interdiffusion. Further, because, while the Fe-doped semiconductor layer captures only electrons, the Ru-doped semiconductor layer has a characteristic to capture not only electrons but also holes, leakage current is also effectively suppressed.

On the other hand, because crystal growth conditions of the Ru-doped semiconductor layer for obtaining a high resistivity are very strict, as described in the above-mentioned Japanese Patent No. 4249222, when only a particularly thick Ru-doped semiconductor layer is used as the buried layer, it may be difficult to suppress the reactive current. Further, as disclosed in Japanese Patent No. 4049562, even when a thin Ru-doped semiconductor layer is used, if the resistivity of the Ru-doped semiconductor layer is low, the effect of suppressing the reactive current is decreased.

Meanwhile, according to Embodiment 3, even if the resistivity of the Ru-doped semiconductor layer is comparable to that of a low carrier concentration semiconductor layer (undoped i-type InP layer), insofar as interdiffusion between Ru and Zn is not caused, the Fe-doped semiconductor layer may sufficiently suppress leakage the current and may decrease the parasitic capacitance of the buried layer, and thus, compared with the case disclosed in Japanese Patent No. 4249222, stable characteristics may be obtained.

Embodiment 4

Figure 6:
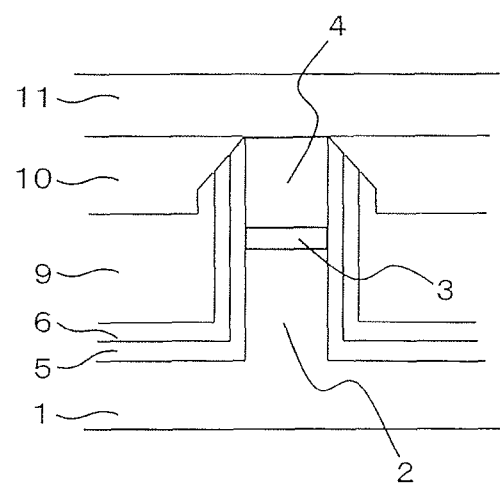
FIG. 6 is a sectional view illustrating a structure of a semiconductor optical element according to Embodiment 4 of the present invention.

FIG. 6 is a sectional view illustrating a structure of a semiconductor optical element according to Embodiment 4 of the present invention. Here, as an example of the semiconductor optical element, a distributed-feedback semiconductor laser is described.

In FIG. 6, the p-type cladding InP layer 2, the active layer 3, and the n-type cladding InP layer 4 are laminated in the stated order from the bottom on the InP substrate 1 to form the mesa-stripe-shaped laminate. The buried layer is formed on each side of the laminate.

In the buried layer, the first p-type InP layer 5, the first n-type InP layer 6, the undoped i-type InP layer 9, and the second p-type InP layer 10 are laminated in the stated order from the bottom. The n-type contact layer 11 is formed on the laminate and the buried layers.

Here, the undoped i-type InP layer 9 is not grown on the (111)B surface of the crystal plane formed by the first p-type InP layer 5 and the first n-type InP layer 6.

It is to be noted that, otherwise, the structure is similar to that of Embodiment 1, and thus, description thereof is omitted.

According to Embodiment 4, because there is no need to consider interdiffusion, compared with the case of the above-mentioned Embodiment 1, there is an advantage that a semiconductor optical element is more easily materialized. Further, by forming the low carrier concentration semiconductor layer (undoped i-type InP layer) so as to be as thick as about 0.5 to 3 µm, the parasitic capacitance of the buried layer may be decreased and high speed response characteristics may be materialized.

It is to be noted that, in accordance with the thickness of the low carrier concentration semiconductor layer, the height of the mesa-stripe-shaped laminate and the shape of the low carrier concentration semiconductor layer are required to be controlled. Here, when the growth occurs as described in Japanese Patent Application Laid-open No. Hei 08-213691, because the low carrier concentration semiconductor layer is abnormally grown in proximity to the mesa-stripe-shaped portion, leakage current is caused through the low carrier concentration semiconductor layer which exhibits characteristics similar to those of an n-type semiconductor. Therefore, as described in Japanese Patent Application Laid-open No. Hei 08-213691, the low carrier concentration semiconductor layer may be grown only to a thickness of about 0.3 µm, and the parasitic capacitance of the buried layer may not be sufficiently decreased.

On the other hand, in the semiconductor optical element according to Embodiment 4 of the present invention, when the low carrier concentration semiconductor layer is grown, by introducing a halogenated gas such as HCl into a growth chamber, the growth of the low carrier concentration semiconductor layer on the (111)B surface may be suppressed. Therefore, even when the low carrier concentration semiconductor layer is thickly grown, leakage current is satisfactorily suppressed, the parasitic capacitance of the buried layer is decreased by the thick low carrier concentration semiconductor layer, and high speed response characteristics may be materialized.

Embodiment 5

Figure 7:
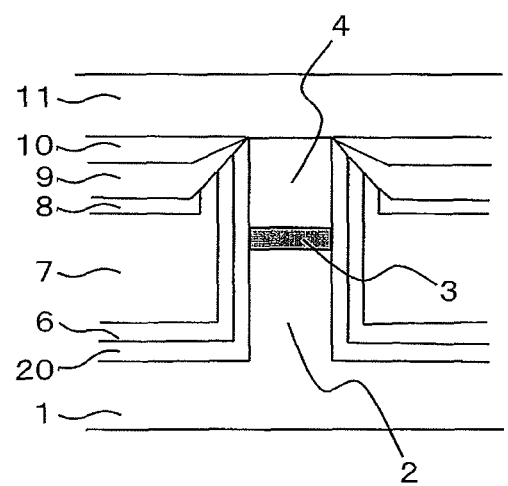
FIG. 7 is a sectional view illustrating a structure of a semiconductor optical element according to Embodiment 5 of the present invention.

FIG. 7 is a sectional view illustrating a structure of a semiconductor optical element according to Embodiment 5 of the present invention.

In a distributed-feedback semiconductor laser illustrated in FIG. 7, the first p-type InP layer 5 illustrated in FIG. 1 is replaced by a p-type AlInAs layer 20. It is to be noted that the first p-type InP layer 5 illustrated in FIG. 1 may be replaced by a p-type AlGaInAs layer, or a part of the first p-type InP layer 5 may be replaced by the p-type AlInAs layer 20 or the p-type AlGaInAs layer.

According to Embodiment 5, by using an AlInAs layer or AlGaInAs layer which has a high barrier to electrons, compared with the case of the above-mentioned Embodiment 1, leakage current may be more satisfactorily suppressed.

It is to be noted that a structure similar to that of Embodiment 5 may also be applied to the first p-type InP layer 5 illustrated in FIG. 6.

Embodiment 6

Figure 8:
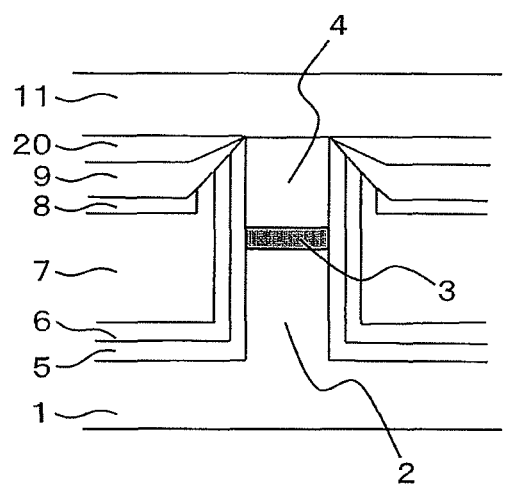
FIG. 8 is a sectional view illustrating a structure of a semiconductor optical element according to Embodiment 6 of the present invention.

FIG. 8 is a sectional view illustrating a structure of a semiconductor optical element according to Embodiment 6 of the present invention.

In a distributed-feedback semiconductor laser illustrated in FIG. 8, the second p-type InP layer 10 illustrated in FIG. 1 is replaced by the p-type AlInAs layer 20. It is to be noted that the second p-type InP layer 10 illustrated in FIG. 1 may be replaced by the p-type AlGaInAs layer, or a part of the second p-type InP layer 10 may be replaced by the p-type AlInAs layer 20 or the p-type AlGaInAs layer.

According to Embodiment 6, by using an AlInAs layer or AlGaInAs layer which has a high barrier to electrons, compared with the case of the above-mentioned Embodiment 1, leakage current may be more satisfactorily suppressed.

It is to be noted that a structure similar to that of Embodiment 6 may also be applied to the second p-type InP layer 10 illustrated in FIG. 6. Further, a combination of Embodiment 6 and Embodiment 5 described above may also be applied.

Embodiment 7

Figure 9:
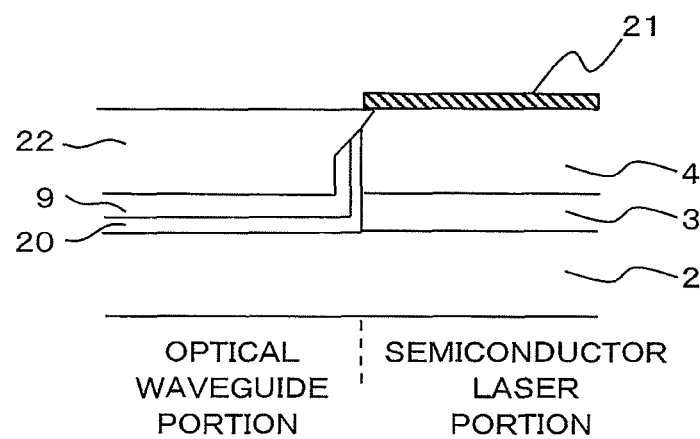
FIG. 9 is a sectional view illustrating a structure of an integrated semiconductor optical element according to Embodiment 7 of the present invention.
Figure 10A:
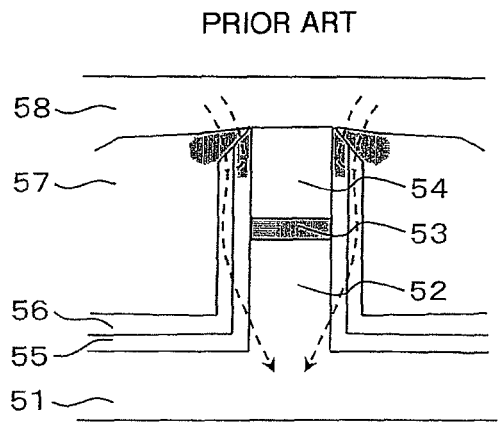
FIGS. 10A to 10D are sectional views illustrating structures of conventional semiconductor optical elements.
Figure 10B:
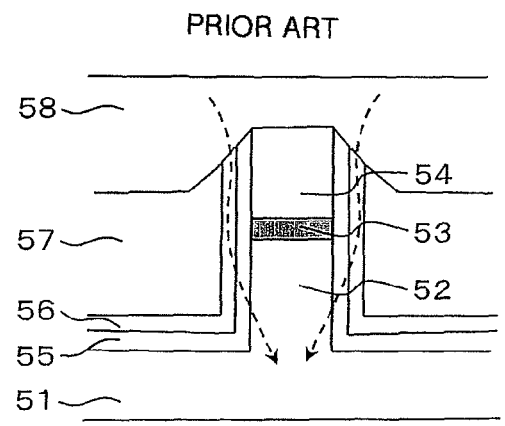
Figure 10C:
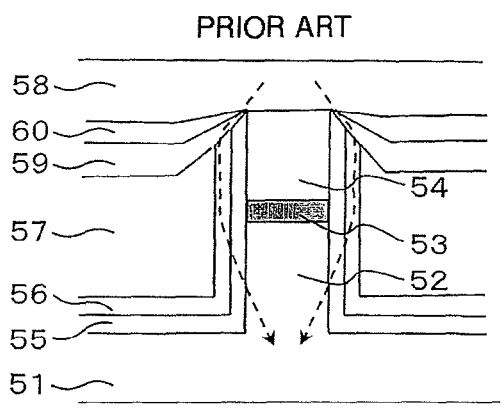
Figure 10D:
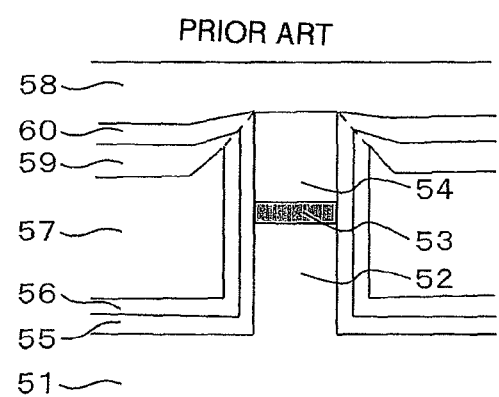
Figure 11:
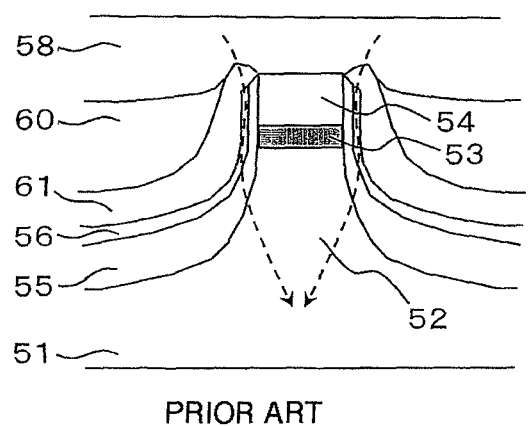
FIG. 11 is a sectional view illustrating another structure of the conventional semiconductor optical element.
Figure 12:
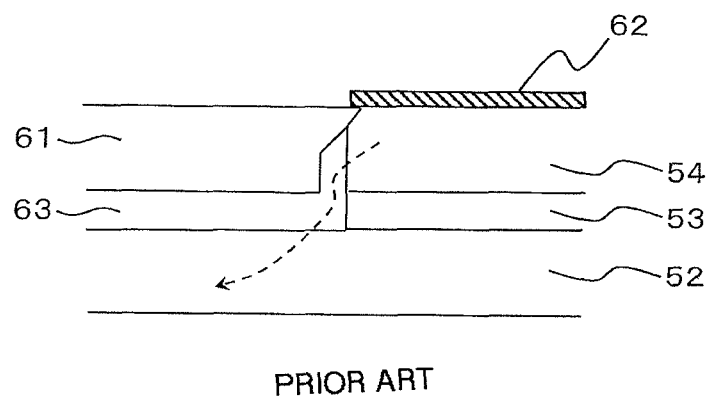
FIG. 12 is a sectional view illustrating a structure of a conventional integrated semiconductor optical element.

FIG. 9 is a sectional view illustrating a structure of an integrated semiconductor optical element according to Embodiment 7 of the present invention. Here, as an example, an integrated semiconductor optical element in which an optical waveguide is formed by butt joint regrowth with respect to a distributed-feedback semiconductor laser is described.

In FIG. 9, the active layer 3 and the n-type cladding InP layer 4 are laminated in the stated order from the bottom on a part of the p-type cladding InP layer 2 which is laminated on the InP substrate to form the mesa-stripe-shaped laminate.

Similarly to the case of Embodiment 1, a buried layer is formed on a side portion of the laminate. The distributed-feedback semiconductor laser is formed as a semiconductor laser portion of the integrated semiconductor optical element. The semiconductor laser portion is masked by an insulating filmmask 21 for selective growth, a regrown semiconductor layer is formed by selective growth so as to be connected to an end face of a resonator of the semiconductor laser, and an optical waveguide portion of the integrated semiconductor optical element is formed.

In the regrown semiconductor layer, the p-type AlInAs layer 20, the undoped type InP layer 9, and an undoped i-type semiconductor layer 22 are laminated in the stated order from the bottom. It is to be noted that the p-type AlInAs layer 20 may be a p-type AlGaInAs layer, a low carrier concentration AlInAs layer, or a low carrier concentration AlGaInAs layer.

Here, the layer containing Al (p-type AlInAs layer 20 or the like) is formed so as not to be exposed at a frontmost surface after the selective growth.

According to Embodiment 7, by using the AlInAs layer or the AlGaInAs layer which has a high barrier to electrons, an integrated semiconductor optical element which may suppress leakage current and may materialize high speed response characteristics may be obtained.

It is to be noted that, if the layer containing Al (p-type AlInAs layer or the like) is exposed at a frontmost surface after the selective growth, there is a risk that, in regrowing a contact layer or the like, abnormal growth due to an oxide layer of Al occurs.

On the other hand, in the integrated semiconductor optical element according to Embodiment 7 of the present invention, by carrying out etching in a growth chamber using a halogenated gas such as HCl immediately after the layer containing Al is grown, the layer containing Al is completely covered with the InP layer laminated thereafter before the layer containing Al is brought into contact with the atmosphere. Therefore, an integrated semiconductor optical element may be materialized with stability without abnormal growth and with leakage current being suppressed.

It is to be noted that, in the above-mentioned Embodiments 1 to 7, as examples of the semiconductor optical element, distributed-feedback semiconductor lasers are described. However, the present invention is not limited thereto. The structures of the buried layers described in Embodiments 1 to 7 may be applied to semiconductor optical elements such as a Fabry-Perot semiconductor laser, a semiconductor modulator, a semiconductor optical amplifier, a photodiode, and an avalanche photodiode.

In those cases, also, a semiconductor optical element which suppresses reactive current and dark current and has high speed response characteristics may be materialized with stability.

Further, in the above-mentioned Embodiment 7, as an example, an integrated semiconductor optical element in which an optical waveguide is formed by butt joint regrowth with respect to a distributed-feedback semiconductor laser is described. However, the present invention is not limited thereto. An integrated semiconductor optical element in which a distributed-feedback semiconductor laser is integrated with a semiconductor optical element such as a semiconductor modulator or a semiconductor optical amplifier may be formed. Further, the distributed-feedback semiconductor laser may be a Fabry-Perot semiconductor laser or a ridge semiconductor laser.

In those cases, also, an integrated semiconductor optical element which suppresses reactive current and dark current and has high speed response characteristics may be materialized with stability.

Further, the structure of the buried layers described in any one of the above-mentioned Embodiments 1 to 6 may be applied to the semiconductor optical element portion of the integrated semiconductor optical element such as an optical waveguide, a semiconductor modulator, or a semiconductor optical amplifier.

In those cases, each of the semiconductor optical elements which are integrated suppresses reactive current and the operation efficiency of the integrated semiconductor optical element as a whole may be improved.

Further, the structure of the buried layers described in any one of the above-mentioned Embodiments 1 to 6 may be applied to the buried layer of at least one semiconductor optical element portion such as a distributed-feedback semiconductor laser, a Fabry-Perot semiconductor laser, an optical waveguide, a semiconductor modulator, or a semiconductor optical amplifier of the integrated semiconductor optical element.

In those cases, by using the structure of the buried layers according to the present invention at a plurality of locations, reactive current may be more satisfactorily suppressed.

Further, in the above-mentioned Embodiments 1 to 7, the polarity may be the opposite. More specifically, the p-type semiconductors may be n-type semiconductors and the n-type semiconductor may be p-type semiconductors.

In those cases, also, effects similar to those of the above-mentioned Embodiments 1 to 7 may be obtained.

What is claimed is:

1. A semiconductor optical element, comprising:
   a p-type semiconductor substrate;
   a mesa-stripe-shaped laminated structure including a p-type cladding layer, an active layer, and an n-type cladding layer, arranged in that order, from the p-type semiconductor substrate; and
   a burying layer structure located adjacent and contiguous to opposed sides of the mesa-stripe-shaped laminated structure, wherein:
   the burying layer structure includes, laminated, a first p-type semiconductor layer, an n-type semiconductor layer, an Fe-doped semiconductor layer, a low carrier concentration semiconductor layer, and a second p-type semiconductor layer, arranged in that order from the p-type semiconductor substrate, alongside the mesa-stripe-shaped laminated structure, toward the n-type cladding layer,
   each of the first p-type semiconductor layer, the n-type semiconductor layer, and the Fe-doped semiconductor layer has, proximate the sides of the mesa-stripe-shaped laminated structure, a (111)B surface, with the (111)B surfaces of the first p-type semiconductor layer, the n-type semiconductor layer, and the Fe-doped layer, lying in respective planes at the opposed sides of the mesa-stripe-shaped laminated structure,
   the Fe-doped semiconductor layer is not present on the (111)B surface of the first p-type semiconductor layer,
   the Fe-doped semiconductor layer is not present on the (111)B surface of the n-type semiconductor layer,
   the low carrier concentration semiconductor layer is present on the (111)B surface of the first p-type semiconductor layer, the low carrier concentration semiconductor layer is present on the (111)B surface of the n-type semiconductor layer, and the low carrier concentration semiconductor layer is present on the (111)B surface of the Fe-doped semiconductor layer.

2. The semiconductor optical element according to claim 1, wherein the first and second p-type semiconductor layers are doped with Zn, the n-type semiconductor layer completely separates the first p-type semiconductor layer from the Fe-doped semiconductor layer and prevents diffusion of Zn from the first p-type semiconductor layer into the Fe-doped semiconductor layer, and the low carrier concentration semiconductor layer completely separates the second p-type semiconductor layer from the Fe-doped semiconductor layer and prevents diffusion of Zn from the second p-type semiconductor layer into the Fe-doped semiconductor layer.

3. The semiconductor optical element according to claim 1, wherein the first p-type semiconductor layer, the n-type semiconductor layer, and the low carrier concentration semiconductor layer are InP.

4. A semiconductor optical element, comprising:

a p-type semiconductor substrate;

a mesa-stripe-shaped laminated structure including a p-type cladding layer, an active layer, and an n-type cladding layer, arranged in that order, from the p-type semiconductor substrate; and a burying layer structure located adjacent and contiguous to opposed sides of the mesa-stripe-shaped laminated structure, wherein:

the burying layer structure includes, laminated, a first p-type semiconductor layer of InP doped with Zn, an n-type semiconductor layer of InP, an Fe-doped semiconductor layer, an undoped InP layer, and a second p-type semiconductor layer doped with Zn, arranged in that order from the p-type semiconductor substrate, alongside the mesa-stripe-shaped laminated structure, toward the n-type cladding layer, each of the first p-type semiconductor layer, the n-type semiconductor layer, and the Fe-doped semiconductor layer has, proximate the opposed sides of the mesa-stripe-shaped laminated structure, a (111)B surface, with the (111)B surfaces of the first p-type semiconductor layer, the n-type semiconductor layer, and the Fe-doped layer, lying in respective planes at the opposed sides of the mesa-stripe-shaped laminated structure, the Fe-doped semiconductor layer is not present on the (111)B surface of the first p-type semiconductor layer, the Fe-doped semiconductor layer is not present on the (111)B surface of the n-type semiconductor layer, the undoped InP layer is present on the (111)B surface of the first p-type semiconductor layer, the undoped InP layer is present on the (111)B surface of the n-type semiconductor layer, the undoped InP layer is present on the (111)B surface of the Fe-doped semiconductor layer, the n-type semiconductor layer completely separates the first p-type semiconductor layer from the Fe-doped semiconductor layer and prevents diffusion of Zn from the first p-type semiconductor layer into the Fe-doped semiconductor layer, and the undoped InP layer completely separates the second p-type semiconductor layer from the Fe-doped semiconductor layer and prevents diffusion of Zn from the second p-type semiconductor layer into the Fe-doped semiconductor layer.

* * * * *